US007439710B2

(12) United States Patent
Ishishita

(10) Patent No.: US 7,439,710 B2
(45) Date of Patent: Oct. 21, 2008

(54) BATTERY PACK CAPACITY CONTROL SYSTEM

(75) Inventor: Teruo Ishishita, Nishikamo-gun (JP)

(73) Assignee: Toyota Jidosha Kabushiki Kaisha, Toyota-shi (JP)

(*) Notice: Subject to any disclaimer, the term of this patent is extended or adjusted under 35 U.S.C. 154(b) by 262 days.

(21) Appl. No.: 10/563,462

(22) PCT Filed: Jul. 26, 2004

(86) PCT No.: PCT/IB2004/002385

§ 371 (c)(1),
(2), (4) Date: Jan. 5, 2006

(87) PCT Pub. No.: WO2005/010539

PCT Pub. Date: Feb. 3, 2005

(65) Prior Publication Data
US 2006/0152195 A1 Jul. 13, 2006

(30) Foreign Application Priority Data
Jul. 29, 2003 (JP) ............... 2003-281429

(51) Int. Cl.
H02J 7/00 (2006.01)
G01N 27/416 (2006.01)
(52) U.S. Cl. ...................... 320/132; 324/427
(58) Field of Classification Search ................ 320/132; 324/426, 427, 434
See application file for complete search history.

(56) References Cited

U.S. PATENT DOCUMENTS 6,133,707 A 10/2000 Kikuchi et al.
6,359,419 B1 3/2002 Verbrugge et al.
6,472,879 B2 * 10/2002 Park ..................... 324/426
6,828,758 B2 12/2004 Ishishita

FOREIGN PATENT DOCUMENTS

| EP | 0 909 001 A2 | 4/1999 |
| EP | 909001 A2 * | 4/1999 |
| EP | 0 967 108 A | 12/1999 |
| EP | 0 909 001 A3 | 4/2000 |
| JP | 11-174135 A | 7/1999 |
| JP | 2000-014029 A | 1/2000 |
| JP | 2000209782 A * | 7/2000 |
| JP | 2001157366 A * | 6/2001 |
| JP | 2003111204 A * | 4/2003 |
| JP | 2003-244860 A | 8/2003 |

* cited by examiner

Primary Examiner—Akm E Ullah
Assistant Examiner—Ramy Ramadan
(74) Attorney, Agent, or Firm—Kenyon & Kenyon LLP

(57) ABSTRACT

If the capacity variation is greater than a pre-stored value, the SOC converted from Qmin sometimes cannot recover to a control center value. In such a case, inconveniences including the continuation of an event where the HVECU cannot output a command to stop the charging are prevented by computing an apparatus SOC and reporting the SOC to the HVECU. The apparent SOC is computed by increasing the value of SOC in accordance with the magnitude of the capacity variation. The thus-computed apparent SOC is reported to the HVECU by the battery ECU, so that it can be determined that the control center value has been exceeded. Thus, it becomes possible to provide battery control apparatus, method and program and a battery control system for a battery pack which are capable of controlling the charging/discharging of the battery pack with an improved accuracy despite capacity variation.

8 Claims, 7 Drawing Sheets

F I G . 6A
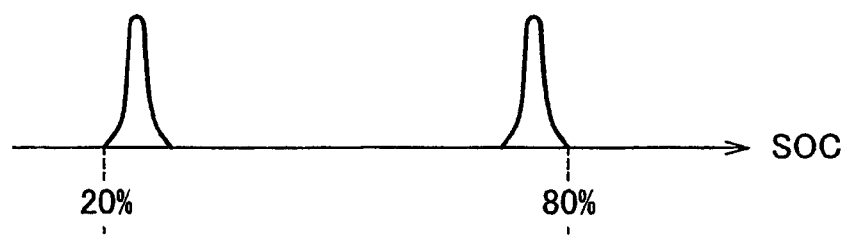
F I G . 6B
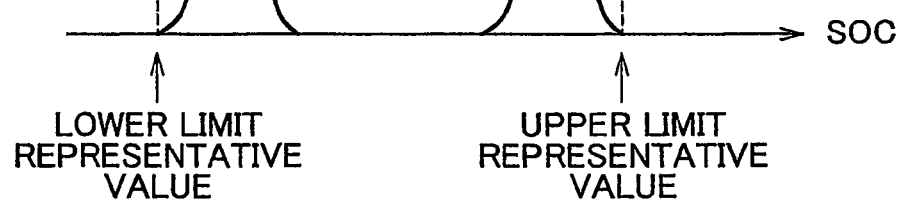

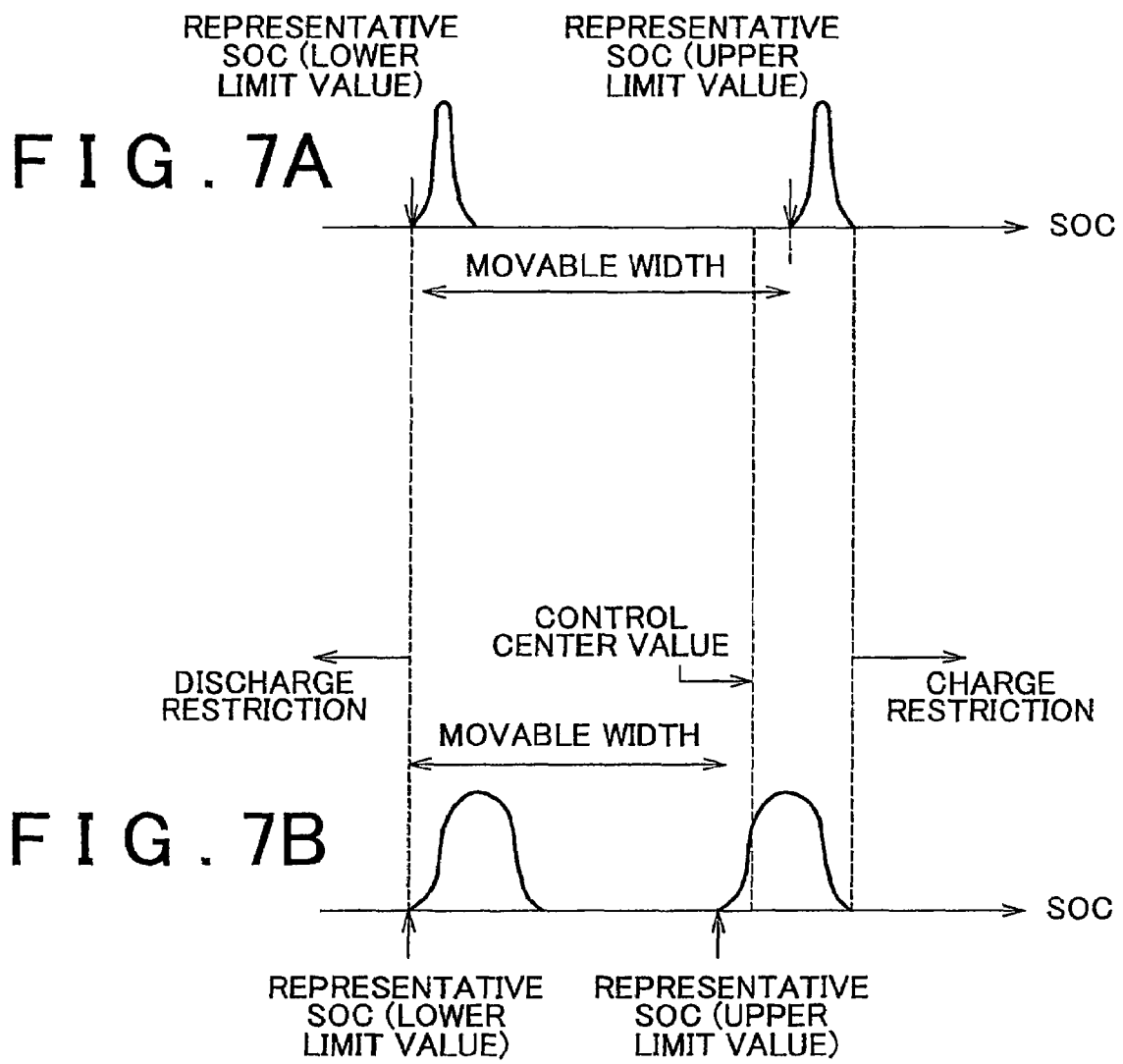

US 7,439,710 B2

BATTERY PACK CAPACITY CONTROL SYSTEM

This is a 371 national phase application of PCT/IB2004/002385 filed 26 Jul. 2004, claiming priority to Japanese Patent Application No. 2003-281429 filed 29 Jul. 2003, the contents of which are incorporated herein by reference.

BACKGROUND OF THE INVENTION

1. Field of the Invention

The invention relates to charge/discharge control apparatus, method and program for controlling the charging and discharging of a secondary battery formed by a battery pack constituted of a plurality of unit batteries, and a battery control system.

2. Description of the Related Art

Hybrid vehicles equipped with an electric power generator driven by an engine, in addition to a vehicle-driving electric motor, are known. In such a hybrid vehicle, a battery pack formed by connecting a plurality of unit batteries (e.g., battery cells, battery blocks, etc.) in series is mounted. The battery pack drives the vehicle-driving motor by supplying electric power to the motor, and is charged with electric power from the generator (that, in some cases, serves as a vehicle-driving motor as well).

FIG. 5 shows an example of the construction of a battery control system 1100 for the charge/discharge control of a battery pack as described above. In FIG. 5, a battery pack 112 in which a plurality of battery cells 110 are connected in series is connected to a voltage detector 114 provided for detecting the voltage of each battery cell 110. On the basis of the output of the voltage detector 114, a battery ECU 116 computes a value regarding the state of charge (SOC) of each battery cell 110. The value of voltage detected by the voltage detector 114 may be the value of voltage of each battery cell 110 as described above. Furthermore, since the battery pack 112 has a series-connected arrangement of a plurality of battery blocks each of which is formed by connecting a plurality of battery cells 110 in series, the value of voltage detected by the voltage detector 114 may be the value of voltage of each battery block. In this case, the battery ECU 116 computes the SOC of each battery block from the value of voltage of the battery block. On the basis of the thus-computed SOC value, an HVECU 118 controls loads 120 that include a vehicle-driving electric motor, a generator-driving engine, a generator, an inverter, etc., and performs control of adjusting the amount of charge or discharge of the battery pack 112 so that the SOC value of the battery pack 112 is within a predetermined range. A typically adopted control range of SOC is, for example, the range of 20% to 80%. An SOC control method for the battery pack 112 as described above is disclosed in, for example, Japanese Patent Application Laid-Open Publication No. 2000-14029.

If, in the foregoing related-art control method, the SOC of the battery pack 112 is controlled so as to be within a predetermined range, for example, the range of 20% to 80%, the lower limit value (20%) and the upper limit value (80%) of the control range provide different representative values of SOC of the battery pack 112 as indicated in FIGS. 6A and 6B (where the vertical axis indicates the number of unit batteries of a battery pack and the horizontal axis indicates the SOC of each unit battery). That is, if the SOC of the entire battery pack 112 is controlled with reference to the lower limit value of the control range, the control is performed as follows. That is, the remaining capacity of each battery cell 110 or each battery block is determined from the voltage thereof. The minimum value among the remaining capacities of the battery cells or battery blocks is determined as a representative SOC for the control of the SOC of the entire battery pack 112, that is, the control is performed so that the representative SOC does not fall below the lower limit value. If the SOC of the entire battery pack 112 is controlled with reference to the upper limit value of the control range, the control is performed as follows. That is, the maximum value among the remaining capacities of the individual battery cells 110 or the individual battery blocks is determined as a representative SOC of the battery pack 112, and the control is performed so that the representative SOC does not exceed the upper limit value.

The variation among the charge/discharge capabilities of the individual battery cells 110 increases with increasing time of use of the battery pack 112. That is, during an initial period of use of the battery pack 12, the variation in SOC among the battery cells 110 or the battery blocks is small as indicated in FIG. 6A. However, as time elapses, the variation in SOC increases as indicated in FIG. 6B. According to the above-described control method, however, since the minimum and maximum values of the varying SOC values are used for the control of the lower and upper limits of the control range, the SOC values of all the battery cells 110 or all the battery blocks are always within the control range.

The method disclosed in Japanese Patent Application Laid-Open Publication No. 2000-14029 has a problem of complicated computation for the SOC control since the SOC is controlled with reference to the lower and upper limit values of the control range. In order to solve this and other problems, the present inventors have proposed a battery pack charge/discharge control method capable of carrying out the SOC control through simple computation (Japanese Patent Application No. 2002-43216). The method of the patent application No. 2002-43216 is characterized in that the minimum value of the capacities of unit batteries (e.g., battery cells or battery blocks) constituting a battery pack is computed, and the minimum capacity value is set as a representative SOC, that is, as a reference value, and the representative SOC (control state-of-charge charge) is used for the control.

However, according to the control method of the aforementioned patent application, it sometimes becomes impossible to increase the representative SOC to a control center value if the capacity variation among the unit batteries (capacity differences among the unit batteries) becomes great (e.g., if the capacity variation rapidly increases due to occurrence of an abnormality or the like within the battery in addition to an increase in the capacity variation resulting from the normal use of the battery).

Such a case is exemplified in FIGS. 7A and 7B (where the vertical axis indicates the number of unit batteries of a battery pack and the horizontal axis indicates the SOC of each unit battery). FIG. 7A indicates a case where the capacity variation among the unit batteries of the battery pack is small whereas FIG. 7B indicates a case where the capacity variation has become great. Since the unit battery having the maximum capacity value in the battery pack is restricted in the charging operation by an upper limit value, the upper limit value of the minimum capacity value among the unit batteries, that is, the upper limit value of the representative SOC, decreases with the increasing variation in capacity. Therefore, when the movable width of the representative SOC reduces due to decreases in the representative SOC (upper limit value) and the capacity variation increases to or beyond a certain extent, it becomes impossible to increase the representative SOC to the control center value (FIG. 7B). If the representative SOC cannot be increased to the control center value, there occurs an inconvenience in which even though the battery pack is actually charged to a considerable extent, it is determined that recovery to a sufficiently charged state has not been accomplished.

Such a case will be described with reference to a hybrid electric vehicle illustrated in FIG. 5. When the representative SOC increases to the control center value, the battery ECU 116 determines that the battery pack 112 has been sufficiently charged. Until an indication of the determination result is transmitted to the HVECU 118, the HVECU 118 continues commanding the load 120 to charge the battery pack 112. That is, the HVECU 118 performs a control of sending a command to the load 120 so as to drive the engine so that engine power is allocated for the charging of the battery pack by the generator in addition to the driving of the vehicle by the vehicle-driving motor. However, when the capacity variation becomes considerably great, the representative SOC (upper limit value) no longer increases to reach the control center value (FIG. 7B). Then, even though the battery pack is considerably charged, the battery ECU 116 determines that the representative SOC has not increased to the control center value. Therefore, the battery ECU 116 does not output to the HVECU 118 an indication that the SOC has increased to the control center value, and the HVECU 118 does not command the load 120 to stop the charging operation. If this event happens, the charging of the battery pack does not stop but inconveniently continues. In some cases, for the continued charging, the engine cannot be stopped. In some other cases, a hunting phenomenon of repetitive alternation between the charging and the stop thereof may occur. Furthermore, during a run of the vehicle, as it is determined that charging is incomplete despite accomplishment of practically maximum charge, the engine power is consumed for the charging of the battery pack 112 by the generator in addition to the driving of the vehicle by the vehicle-driving motor. Hence, there occurs a case where during a run of the vehicle that requires increased power, for example, an uphill run or the like, sufficient energy cannot be supplied for the driving of the vehicle, thus failing to meet a drivability requirement.

SUMMARY OF THE INVENTION

The invention has been accomplished in view of the aforementioned problems and the like, and provides battery control apparatus, method and program and a battery control system for a battery pack which are capable of controlling the charge/discharge of the battery pack with improved accuracy despite capacity differences (capacity variation).

In accordance with an aspect of the invention, a battery pack charge/discharge control apparatus for controlling charge/discharge of a battery pack that is formed by combining a plurality of unit batteries of a secondary battery type, comprising: a charge/discharge restriction device for restricting the charge/discharge based on at least one of a capacity up per limit value and a capacity lower limit value of the unit batteries constituting the battery pack; remaining capacity detection device for detecting remaining capacities of unit batteries constituting the battery pack; control value computation device for computing a control state-of-charge value based on at least one of a minimum value and a maximum value of the detected remaining capacities; capacity difference computation device for computing, as a capacity difference, a remaining capacity difference between the remaining capacity of a first unit battery and the remaining capacity of a second unit battery among the unit batteries whose remaining capacities have been detected, the remaining capacity of the second unit battery being less than the remaining capacity of the first unit battery; storage device for storing a correlation between the capacity difference and an apparent state-of-charge value that is different from the control state-of-charge value; and apparent state-of-charge value computation device for computing an apparent state-of-charge value with reference to the correlation based on the capacity difference.

According to the above-described battery pack charge/discharge control apparatus, an apparent state-of-charge value that is different from the control state-of-charge value is introduced. By computing an apparent state-of-charge value in accordance with the capacity difference value, it becomes possible to prevent, for example, an inconvenience in which it is determined that the control state-of-charge value cannot be increased to a control center value due to a capacity difference value.

It is preferable that the apparatus further comprise apparent state-of-charge value adoption device for adopting the apparent state-of-charge value if the capacity difference is at least a predetermined capacity difference that is stored beforehand.

If the capacity difference value is greater than or equal to a predetermined capacity difference, the apparent state-of-charge value is adopted. If the capacity difference is less than the predetermined capacity difference, a different state-of-charge value is adopted. The adoption of this adoption device in the invention will provide a high-precision charge/discharge control apparatus that possesses the advantages of the use of a different state-of-charge value.

It is also preferable that the charge/discharge control apparatus further comprise control state-of-charge value adoption device for adopting the minimum remaining capacity of the unit batteries constituting the battery pack or a percentage of the minimum remaining capacity to a fully charged capacity value, as a control state-of-charge value for controlling the battery pack, if the capacity difference value is less than a pre-stored predetermined capacity difference value.

If the capacity difference value is less than the predetermined capacity difference, a control apparatus employing a control method proposed in Japanese Patent Application No. 2002-43216 is introduced. That is, the minimum capacity value among the unit batteries that constitute the battery pack is computed, and the minimum capacity value is used as a control state-of-charge value to perform the control. Therefore, advantages of this prior application can be exploited, so that charge/discharge control with improved precision will become possible.

It is also preferable that the capacity difference computation device include maximum remaining capacity detection device for detecting a unit battery having a maximum remaining capacity in the battery pack, and minimum remaining capacity detection device for detecting a unit battery having a minimum remaining capacity in the battery pack, and compute a remaining capacity difference between the maximum remaining capacity and the minimum remaining capacity as a capacity difference value. It is also preferable that a maximum capacity difference be used for determination.

It is preferable that, if the capacity difference value is at least a pre-stored predetermined capacity difference maximum value, the predetermined capacity difference maximum value be adopted instead of the capacity difference value.

This prevents the capacity difference value from becoming excessively great, thereby preventing occurrence of a deficiency in the computation that uses the capacity difference.

It is also preferable that the correlation be expressed by Mathematical Expression (1):

$$SOC = \frac{SOCmid - SOClow}{Qhigh - Qlow - Qd} \times (Qmin - Qlow) + SOClow \quad (1)$$

where SOC is the apparent state-of-charge value, and SOCmid is a control center value of the state-of-charge value, and SOClow is a lower limit set value of the state-of-charge value, and SOChigh is an upper limit set value of the state-of-charge value, and Qlow is a capacity value converted from SOClow, and Qhigh is a capacity value converted from SOChigh, and Qd is the capacity difference, and Qmin is the minimum remaining capacity, and Qmax is the maximum remaining capacity.

It is also preferable that, if in Mathematical Expression (1), the denominator on the right-hand side which is presented as Mathematical Expression (2) is at most a predetermined zero-cross reduction preventative value, the zero-cross reduction preventative value be adopted in place of the denominator expressed by Mathematical Expression (2):

Qhigh−Qlow−Qd  (2)

It is also preferable that, if in Mathematical Expression (1), SOC on the left-hand side becomes greater than a maximum guard value, the maximum guard value be adopted in place of the term on the left-hand side in Mathematical Expression (1).

It is also preferable that, if in Mathematical Expression (1), SOC on the left-hand side becomes less than a minimum guard value, the minimum guard value be adopted in place of the term on the left-hand side in Mathematical Expression (1).

The invention also provides a method and a program similar or corresponding to the above-described apparatus.

As for the method, for example, a battery pack charge/discharge control method in accordance with the invention for controlling charge/discharge of a battery pack that is formed by combining a plurality of unit batteries of a secondary battery type, is characterized by comprising the steps of: restricting the charge/discharge based on at least one of a capacity upper limit value and a capacity lower limit value of the unit batteries constituting the battery pack; detecting remaining capacities of unit batteries constituting the battery pack; computing a control state-of-charge value based on at least one of a minimum value and a maximum value of the detected remaining capacities; computing, as a capacity difference, a remaining capacity difference between the remaining capacity of a first unit battery and the remaining capacity of a second unit battery among the unit batteries whose remaining capacities have been detected, the remaining capacity of the second unit battery being less than the remaining capacity of the first unit battery; storing a correlation between the capacity difference and an apparent state-of-charge value that is different from the control state-of-charge value; and computing an apparent state-of-charge value with reference to the correlation based on the capacity difference.

As for the program, for example, a battery pack charge/discharge control program in accordance with the invention that is read into a computer so as to control charge/discharge of a battery pack that is formed by combining a plurality of unit batteries of a secondary battery type, is characterized by comprising: restricting the charge/discharge based on at least one of a capacity upper limit value and a capacity lower limit value of the unit batteries constituting the battery pack; detecting remaining capacities of unit batteries constituting the battery pack; computing a control state-of-charge value based on at least one of a minimum value and a maximum value of the detected remaining capacities; computing, as a capacity difference, a remaining capacity difference between the remaining capacity of a first unit battery and the remaining capacity of a second unit battery among the unit batteries whose remaining capacities have been detected, the remaining capacity of the second unit battery being less than the remaining capacity of the first unit battery; and computing an apparent state-of-charge value that is different from the control state-of-charge value, with reference to a correlation between the capacity difference and the apparent state-of-charge value. Furthermore, a battery control system in accordance with a further aspect of the invention is characterized by comprising a battery pack charge/discharge control apparatus as described above.

A battery control system comprising a charge/discharge control apparatus, a battery pack, a control computer (e.g., a battery ECU, an HVECU, etc.), a load, etc. in accordance with the invention provides a high-precision charge/discharge control of the battery pack.

The invention provides battery control apparatus, method and program and a battery control system for a battery pack which are capable of controlling the charge/discharge of the battery pack with improved precision.

BRIEF DESCRIPTION OF THE DRAWINGS

The above mentioned and other objects, features, advantages, technical and industrial significance of this invention will be better understood by reading the following detailed description of preferred embodiments of the invention, when considered in connection with the accompanying drawings, in which:

FIGS. 6A and 6B are diagrams illustrating the expansion of the capacity variation in accordance with elapse of time;

FIG. 7A is a diagram illustrating the charge/discharge control performed in the case where the capacity variation is small; and FIG. 7B is a diagram illustrating the charge/discharge control performed in the case where the capacity variation is large.

DETAILED DESCRIPTION OF THE PREFERRED EMBODIMENTS

In the following description and the accompanying drawings, the present invention will be described in more detail in terms of exemplary embodiments.

[Construction in Which Invention is Applied to Hybrid Electric Vehicle (Battery Control System)]

Figure 1:
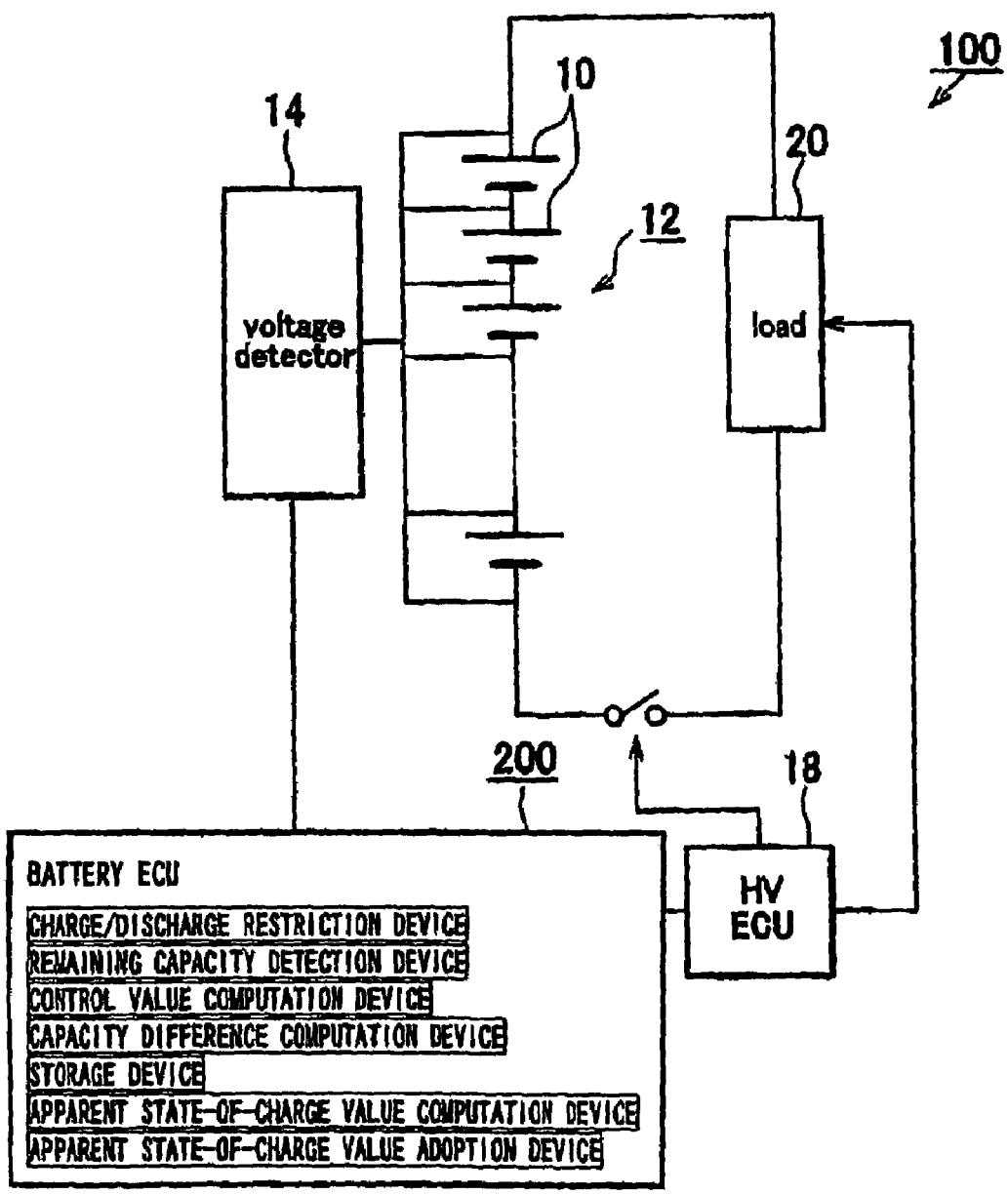
FIG. 1 is a block diagram illustrating the construction of a battery control system in which the charge/discharge control of the invention is applied to a hybrid electric vehicle.

FIG. 1 illustrates a battery control system 100 where a charge/discharge control program in accordance with the invention is applied to a hybrid electric vehicle. The charge/discharge control program of the invention is installed in a battery ECU 200 that is a computer. A battery pack 12 includes a plurality of unit batteries (battery cells or battery blocks) 10 that are connected in series. A voltage detector 14 for detecting the voltage of each unit battery 10 is connected to the battery pack 12. On the basis of the output of the voltage detector 14, the battery ECU 200 computes the SOC of each one of the battery blocks 10 that constitute the battery pack 12. The battery ECU 200 computes the SOC to be transmitted to an HVECU 18 by the charge/discharge control program from the SOC of each unit battery 10. The battery ECU 200 makes a determination regarding the SOC on the basis of the SOCs computed by the battery ECU 200, and controls a load 20 that includes a vehicle-driving electric motor, a generator-driving engine, a generator, an inverter, etc. That is, the battery ECU 200 performs a control of adjusting the amount of charge/discharge of the battery pack 12 so that the SOC of the whole battery pack 12 is within the predetermined range). As for the control range of SOC, the range of, for example, 20% to 80%, is adopted. The battery control system 100 is formed by the battery ECU 200, the HVECU 18, the battery pack 12, the load 20, the voltage detector 14, etc.

Each unit battery 10 constituting the battery pack 12 is a single battery cell or a plurality of battery cells connected in series which are formed by secondary battery cells, for example, Ni-base battery cells, nickel metal hydride (Ni-MH) battery cells, lithium ion battery cells, etc. The SOC of each unit battery 10 may be computed taking into account not only the voltage but also the temperature of the unit battery and the actually measured value of current.

Although in the foregoing construction, the HVECU 18 and the battery ECU 200 are separate from each other, the HVECU 18 and the battery ECU 200 may instead be united into an apparatus. Furthermore, although in the foregoing description, the charge/discharge control program is read into the battery ECU 200, the charge/discharge control program may instead be installed in the HVECU 18.

Examples of the load 20 include an engine ECU, an electric motor ECU, an inverter, a motor-generator, etc. The HVECU 18 outputs an engine output command to the engine ECU that controls the output of the engine and the like, and receives engine output control information from the engine ECU and the like. Furthermore, the HVECU 18 outputs a motor torque command and the like to the motor ECU, and inputs motor control information from the motor ECU. The motor ECU performs the switching control of the inverter. Due to this control, the input to the motor-generator is determined, and driving wheels can be driven in accordance with the output.

Figure 2:
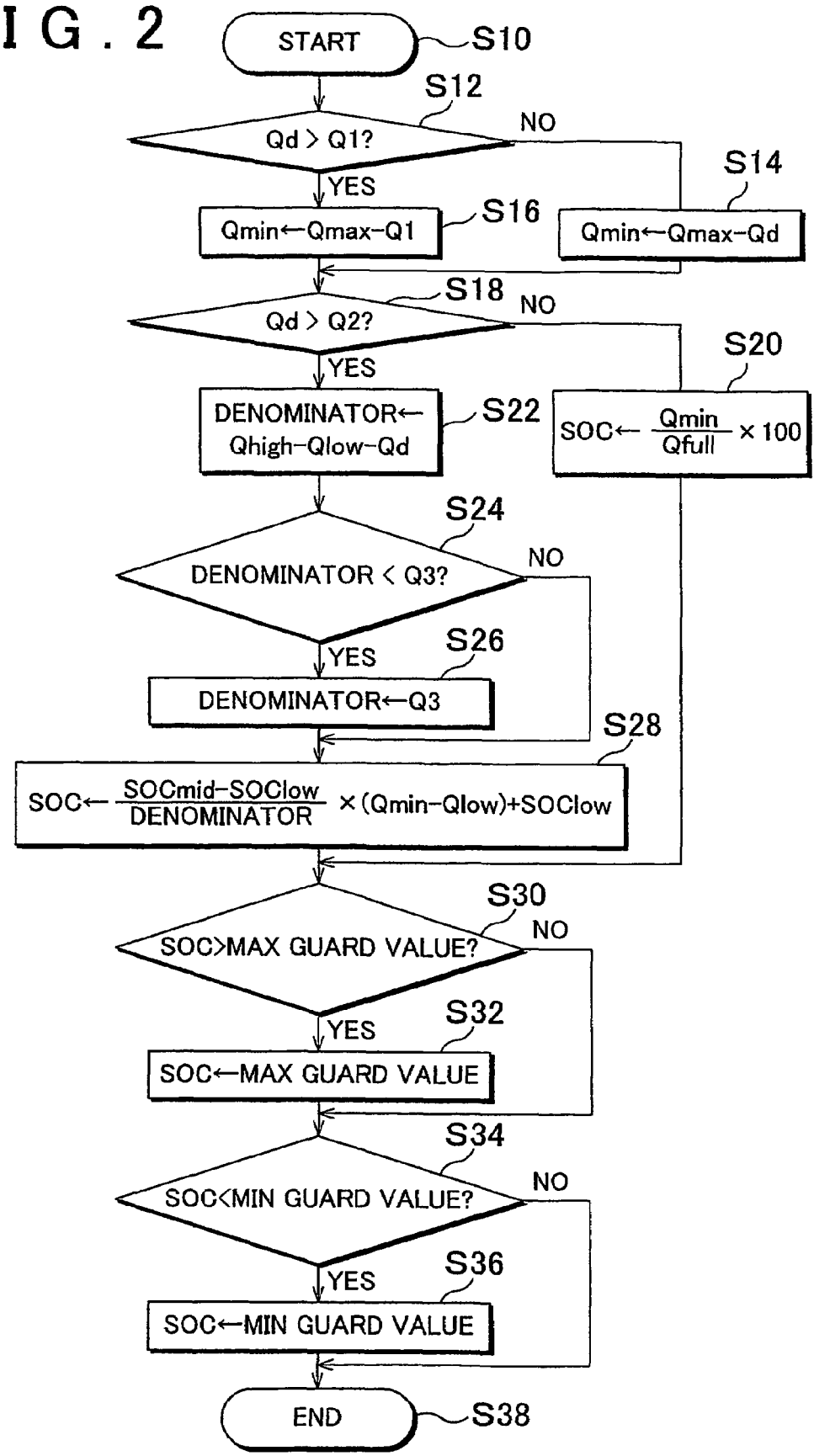
FIG. 2 is a flowchart illustrating a charge/discharge control program in accordance with an embodiment of the invention.

[Charge/Discharge Control Method] A charge/discharge control method carried out by the battery ECU 200 will be described with reference to FIG. 2. The charge/discharge control program (FIG. 2) read into the battery ECU 200 is executed. The battery ECU 200 detects the SOCs of all the unit batteries 10 that constitute the battery pack 12, using the voltage detector 14. The battery ECU 200 computes remaining capacities (Ah) from the SOCs (%). Among the unit batteries 10, the unit battery 10 having the minimum remaining capacity and the unit battery 10 having the maximum remaining capacity are identified. A capacity difference that is a value obtained by subtracting the minimum remaining capacity from the maximum remaining capacity is determined as the value of capacity variation Qd (Ah) among the unit batteries (step 10, which will be simply referred to as "S10").

The capacity variation value (Qd) is compared with a pre-stored upper limit guard value Q1 (Ah) of the capacity variation for SOC computation which is a predetermined maximum capacity difference value (S12). The upper limit guard value Q1 curbs the capacity variation value Qd to a fixed value if the value Qd increases to a maximum value due to an abnormality of a unit battery or the like. That is, in accordance with the invention, the SOC determined from the minimum remaining capacity value (Qmin) among the unit batteries is set as a control state-of-charge value (representative SOC). The value Qmin is determined as a difference between the maximum remaining capacity value (Qmax) and the capacity variation value (Qd) (Qmin=Qmax−Qd). If the value Qd is less than or equal to Q1, the minimum remaining capacity value (Qmin) can be determined as a difference between the maximum remaining capacity value (Qmax) and the capacity variation value (Qd) (Qmin=Qmax−Qd) as usual (S14). However, if Qd is greater than Q1, the value Qd is substituted with Q1, and the minimum remaining capacity value (Qmin) is determined as in Qmin=Qmax−Q1 (S16). This manner of computation prevents the control state-of-charge value from decreasing to a minimum value or to the negative side due to a sudden increase of Qd or the like, and therefore prevents occurrence of a mathematical deficiency or the like.

Figure 3:
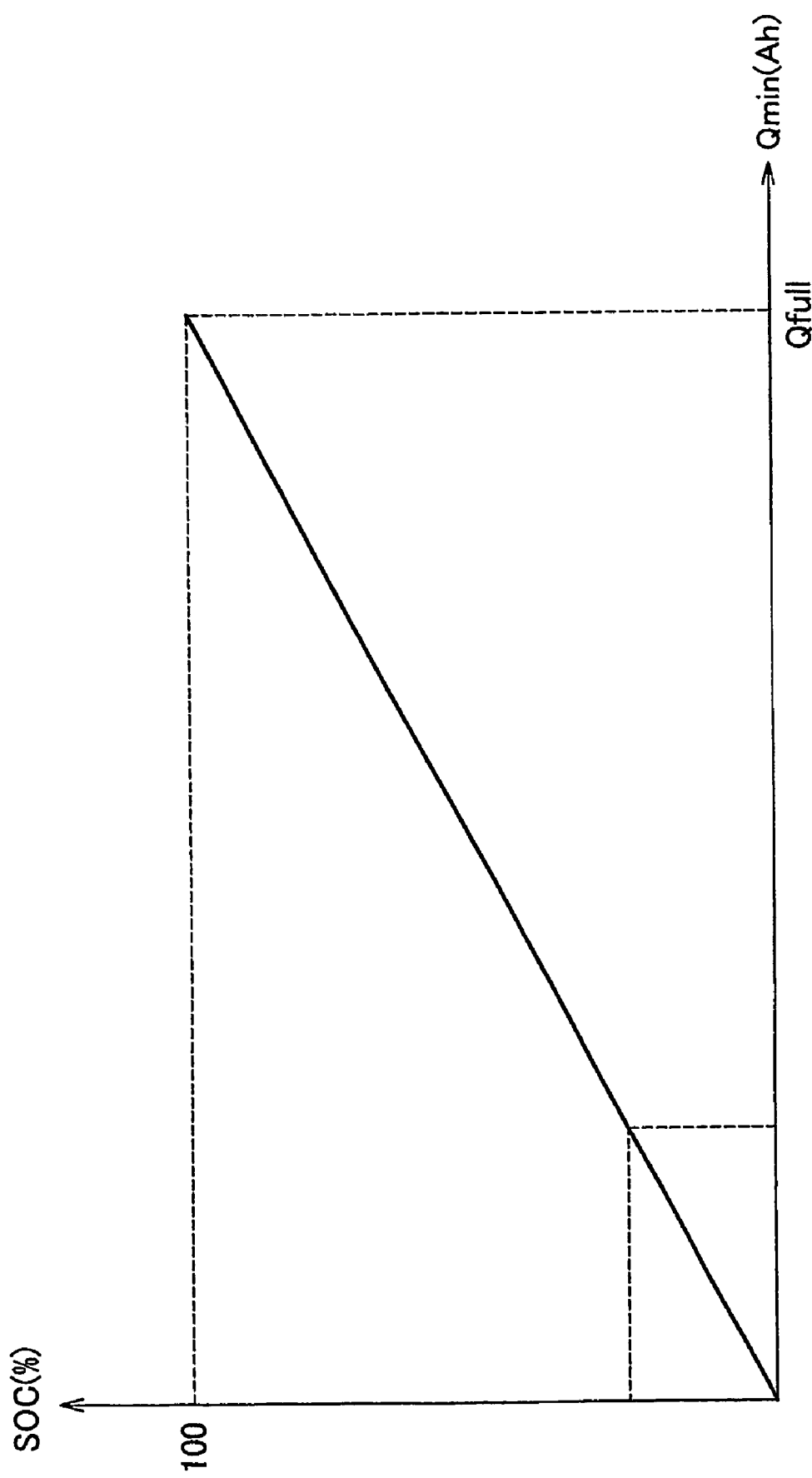
FIG. 3 is an SOC conversion diagram for the case of small variations in capacity.

After determining Qmin, the battery ECU 200 determines an SOC to be reported to the HVECU 18, on the basis of Qmin and Qd. In this stage, the value Qd is compared with a value Q2 (criterion for determining whether to switch the SOC computing method) (S18). The value Q2 is pre-stored. If the capacity variation value (Qd) is less than or equal to Q2, a method as described in Japanese Patent Application No. 2002-43216 mentioned above is employed. That is, the value Qmin is divided by a capacity value of a fully charged state (Qfull), and the thus-determined percentage is set as an SOC to be reported to the HVECU 18 (S20). A relationship therebetween is indicated in FIG. 3. That is, the minimum remaining capacity value (Qmin) has a proportional relationship with the SOC to be reported to the HVECU 18. This is because the capacity variation Qd is small in this case so that the SOC converted from Qmin can return to a control center value (SOCmid) of the state of charge. During this state, it is preferable to utilize advantages of the aforementioned prior application, that is, an expected reduction of the capacity variation and the like. Specifically, if only a minimum SOC (control state-of-charge value, representative SOC) corresponding to Qmin is used to execute the charge/discharge control, the capacity variation can be restrained even in a case where the amount of charge in a unit battery 10 having the maximum SOC or a nearly maximum SOC increases beyond a control range. In each unit battery 10, as the SOC increases, the charging efficiency decreases and the self-discharge increases. Therefore, even if the charge/discharge control is executed through the use of the minimum SOC among the varying SOCs of the unit batteries 10, a relatively great SOC of a unit battery among the varying SOCs is restrained from increasing. Hence, the SOC variation will be prevented from continuing to increase beyond a fixed value, without an operation of overcharging all the unit batteries 10 so as to equalize the SOCs thereof. Thus, the substantial equalization of varying capacities or reduction of the capacity variation eliminates the need to perform an equalization control, and achieves an advantage of avoiding the reduction of battery life caused by overcharge.

If the capacity variation value (Qd) is greater than Q2, the SOC converted from the minimum remaining capacity value (Qmin) (control state-of-charge value or representative SOC) sometimes cannot be returned to the control center value. In such a case, an apparent SOC is computed and the apparent SOC is reported to the HVECU 18, thereby avoiding drawbacks, for example, a drawback in which the HVECU 18 continues to be unable to output a command to stop the charging. Specifically, an operation is performed such that the SOC computed via a solid-line portion indicated in FIG. 4 is greater than the SOC computed in the manner indicated in FIG. 3 (corresponding to a broken-line portion in FIG. 4).

Figure 4:
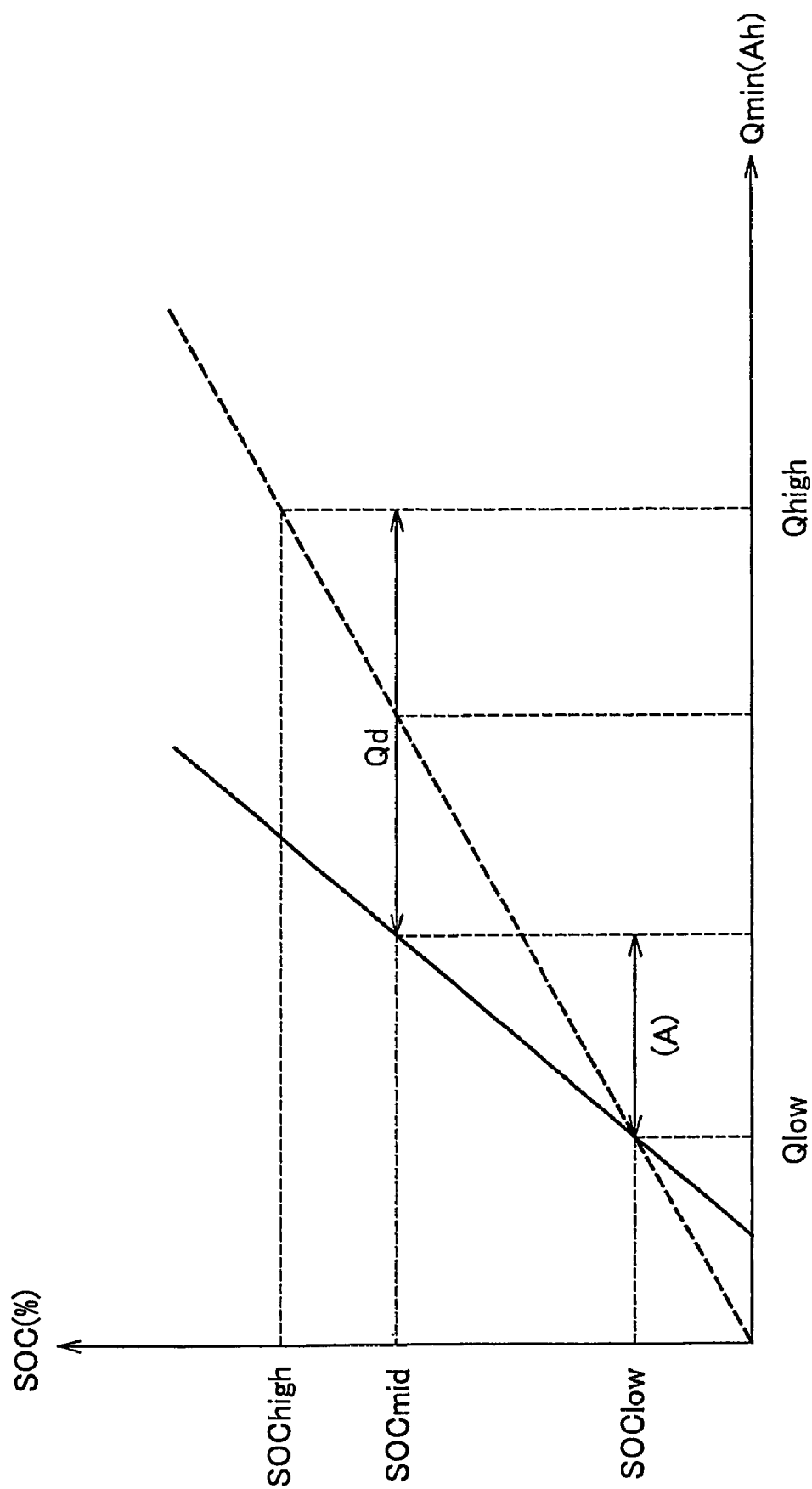
FIG. 4 is an SOC conversion diagram for the case of large variations in capacity.
Figure 5:
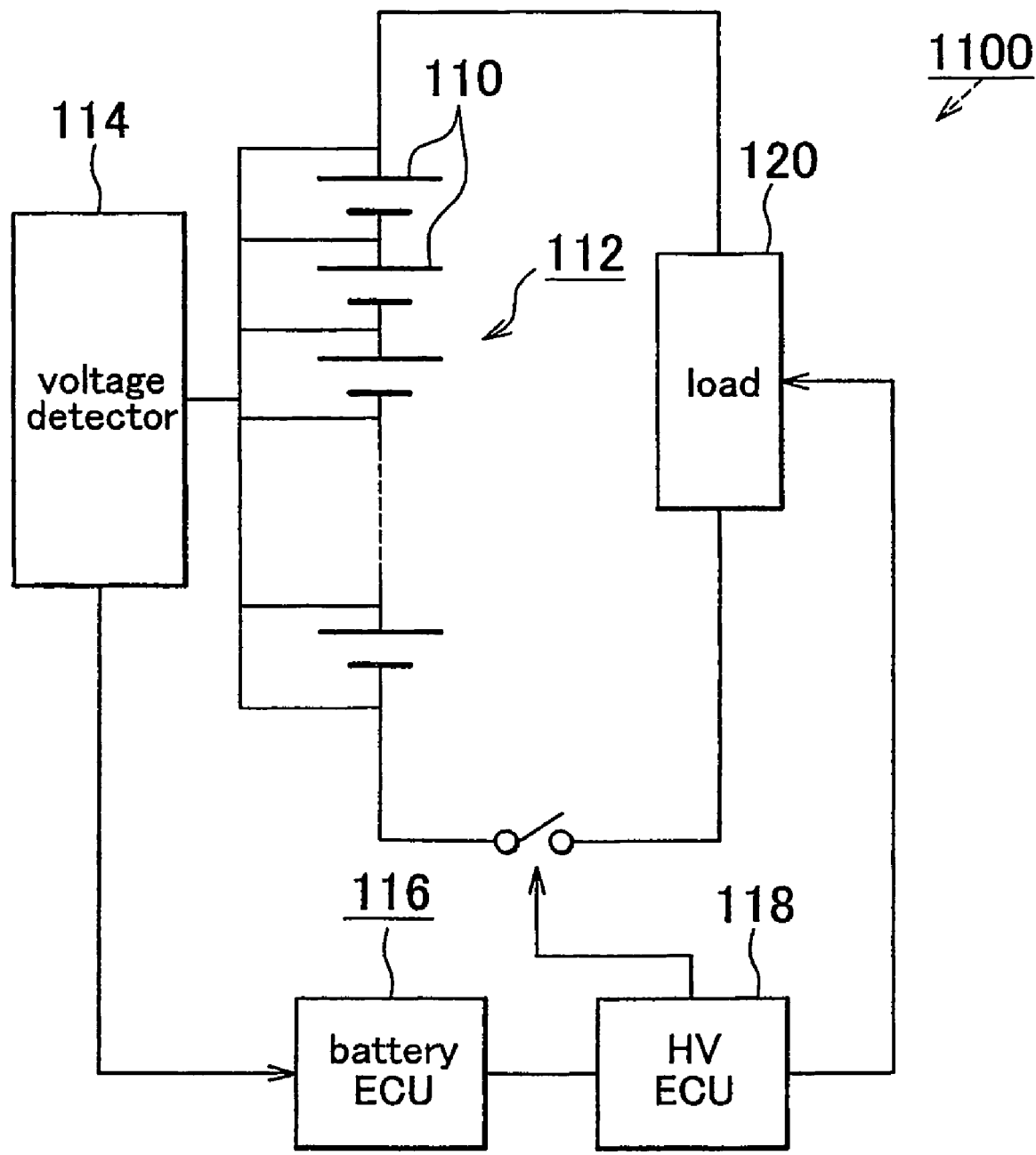
FIG. 5 is a block diagram illustrating the construction of a related-art battery control system.

That is, the aforementioned drawback is solved by setting an increased SOC value with respect to a minimum remaining capacity value Qmin as indicated by the solid-line portion in FIG. 4 in comparison with the SOC value set with respect to the same minimum remaining capacity value Qmin as indicated by the broken-line portion. An increased SOC value in accordance with the magnitude of the capacity variation (Qd) is computed, and is set as an apparent SOC. As the thus-set apparent SOC is reported to the HVECU 18, it is determined that the control center value (SOCmid) has been exceeded. The relational expression of Qd and Qmin (corresponding to the solid-line portion in FIG. 4) is as in Mathematical Expression (1).

$$SOC = \frac{SOCmid - SOClow}{Qhigh - Qlow - Qd} \times (Qmin - Qlow) + SOClow \quad (1)$$

where SOC is the apparent SOC (%), and SOCmid is the control center value (%), and SOClow is an SOC lower limit set value (%), and SOChigh is an SOC upper limit set value (%), and Qlow is a capacity value (Ah) converted from SOClow, and Qhigh is a capacity value (Ah) converted from SOChigh. SOCmid (control center value (%)), SOClow (SOC lower limit set value (%)), and SOChigh (SOC upper limit set value (%)) are set and stored beforehand.

To determine the apparent SOC, the denominator (corresponding to (A) in FIG. 4) in Mathematical Expression (1) is determined as in Mathematical Expression (2) corresponding to the denominator in Mathematical Expression (1) (S22).

$$\text{Denominator } (A) = Qhigh - Qlow - Qd \quad (2)$$

In order to prevent the denominator expressed by Mathematical Expression (2) from becoming a value close to zero or from reducing to a negative value, the value provided by Mathematical Expression (2) is compared with a pre-set value Q3 (denominator lower limit guard value) for preventing reduction across zero (S24). If the value determined through Mathematical Expression (2) is less than Q3, the value Q3 is substituted with the denominator in Mathematical Expression (1) (S26). In this manner, a mathematical deficiency can be avoided. After the denominator in Mathematical Expression (1) is determined, the values of the denominator, SOCmid(%), SOClow(%), SOChigh(%), Qlow(Ah), Qd(Ah) and Qmin(Ah) are substituted in Mathematical Expression (1) to determine the apparent SOC, and the thus-determined apparent SOC is adopted as an SOC to be reported to the HVECU 18 (S28).

The SOC to be reported to the HVECU 18 is mathematically compared with a pre-stored maximum guard (MAX guard) value and a pre-store minimum guard (MIN guard) value. Thus, the SOC is subjected to filtering. If the SOC is greater than the maximum guard value (e.g., SOC of 100%) (S30), the maximum guard value, instead of the SOC, is reported to the HVECU 18 (S32). If the SOC is smaller than the minimum guard value (e.g., SOC of 0%) (S34), the minimum guard value, instead of the SOC, is reported to the HVECU 18 (S36). In this manner, the SOC to be used by the HVECU 18 for determination is reported (S38), so that the charge/discharge control of the battery pack can be performed with high precision. The SOC computation of S10 to S38 illustrated in FIG. 2 is repeatedly executed, so that an SOC value appropriate for the control can be reported to the HVECU 18 all the time.

Even if the capacity variation considerably increases (particularly if there occurs an internal abnormality in the battery, rather than a normal increase in the capacity variation in accordance with elapse of time), execution of the above-described control method prevents an undesired event where the control state-of-charge value, that is, the representative SOC (upper limit value), cannot be increased to the control center value. Therefore, the method prevents the continuation of an event where the battery ECU 200 does not output to the HVECU 18 an indication that the SOC has increased to the control center value. Hence, the method will prevent an event where the charging of the battery does not stop but inconveniently continues, and for the continued charging, the engine cannot be stopped, and will prevent a hunting phenomenon of repetitive alternation between the charging and the stop thereof. Furthermore, the method will prevent an event where during a run of the vehicle, as it is determined that charging is incomplete despite accomplishment of practically maximum charge, the engine power is consumed for the charging of the battery pack 112 by the generator in addition to the driving of the vehicle by the vehicle-driving motor. As a result, it becomes possible to supply sufficient energy for the driving of the vehicle and therefore meet a drivability requirement during a run of the vehicle that requires increased power, for example, an uphill run or the like.

Although in the method of the foregoing embodiment, the charge/discharge control is performed through the use of the minimum value of the remaining capacities of the unit batteries on the basis of a case where the upper limit capacity value of the unit batteries is restricted, it is also possible to carry out a method in which the charge/discharge control is performed through the use of the maximum value of the remaining capacities of the unit batteries on the basis of a case where the lower limit capacity value of the unit batteries is restricted. That is, the invention is also able to prevent undesired events, for example, an event that as the capacity variation increases, a unit battery becomes unable to discharge to a control center value.

The invention is applicable as charge/discharge control apparatus, method and program and a battery control system for substantially all the electric vehicles that have a secondary battery pack (e.g., fuel cell electric vehicles, hybrid electric vehicles that incorporate fuel cells and an internal combustion engine). The charge/discharge control and battery control system of the invention is applicable to various motor vehicles, such as kei cars (or compact cars), normal passenger cars, large and small-size special-purpose vehicles, large-size vehicles (buses, trucks), etc.

The application of the invention is not limited to motor vehicles. Instead, the invention is applicable to substantially all apparatuses and appliances that have a secondary battery (e.g., a lithium ion secondary battery, a Ni-base battery (e.g., a Ni-MH battery, a Ni—Cd battery), a lead storage battery). The invention is also applicable to the charge/discharge control of the secondary battery pack installed in an apparatus or appliance as mentioned above. For example, the invention is applicable to the detection of deterioration of a secondary battery that is used for storage of electricity in home-use or business-purpose fuel cell generator systems. It is also conceivable to apply the invention to the charge/discharge control of secondary battery packs installed in mobile units such as cellular phones, personal computer-related appliances, watercrafts, aircrafts, etc.

The invention claimed is:

1. A battery pack charge/discharge control apparatus for controlling a charge/discharge of a battery pack that is formed by combining a plurality of unit batteries of a secondary battery type, comprising:

a battery ECU, the battery ECU, comprising:
- a charge/discharge restriction device for restricting the charge/discharge based on at least one of a capacity upper limit value and a capacity lower limit value of the unit batteries constituting the battery pack;
- a remaining capacity detection device for detecting remaining capacities of unit batteries constituting the battery pack;
- a control value computation device for computing a control state-of-charge value based on at least one of a minimum value and a maximum value of the detected remaining capacities;
- a capacity difference computation device for computing, as a capacity difference, a remaining capacity difference between the remaining capacity of a first unit battery and the remaining capacity of a second unit battery among the unit batteries whose remaining capacities have been detected, the remaining capacity of the second unit battery being less than the remaining capacity of the first unit battery;
- a storage device for storing a correlation between the capacity difference and an apparent state-of-charge value that is different from the control state-of-charge value;
- an apparent state-of-charge value computation device for computing an apparent state-of-charge value with reference to the correlation based on the capacity difference; and
- an apparent state-of-charge value adoption device for adopting the apparent state-of-charge value if the capacity difference is at least a predetermined capacity difference that is stored beforehand, wherein the correlation is expressed by Mathematical Expression (1):

$$SOC = \frac{SOCmid - SOClow}{Qhigh - Qlow - Qd} \times (Qmin - Qlow) + SOClow \quad (1)$$

where SOC is the apparent state-of-charge value, and SOCmid is a control center value of the state-of-charge value, and SOClow is a lower limit set value of the state-of-charge value, and SOChigh is an upper limit set value of the state-of-charge value, and Qlow is a capacity value converted from SOClow, and Qhigh is a capacity value converted from SOChigh, and Qd is the capacity difference, and Qmin is the minimum remaining capacity, and Qmax is the maximum remaining capacity.

2. A battery pack charge/discharge control apparatus for controlling a charge/discharge of a battery pack that is formed by combining a plurality of unit batteries of a secondary battery type, comprising:

a battery ECU, the battery ECU, comprising:
- a charge/discharge restriction device for restricting the charge/discharge based on at least one of a capacity upper limit value and a capacity lower limit value of the unit batteries constituting the battery pack;
- a remaining capacity detection device for detecting remaining capacities of unit batteries constituting the battery pack;
- a control value computation device for computing a control state-of-charge value based on at least one of a minimum value and a maximum value of the detected remaining capacities;
- a capacity difference computation device for computing, as a capacity difference, a remaining capacity difference between the remaining capacity of a first unit battery and the remaining capacity of a second unit battery among the unit batteries whose remaining capacities have been detected, the remaining capacity of the second unit battery being less than the remaining capacity of the first unit battery;
- a storage device for storing a correlation between the capacity difference and an apparent state-of-charge value that is different from the control state-of-charge value;
- an apparent state-of-charge value computation device for computing an apparent state-of-charge value with reference to the correlation based on the capacity difference; and
- an apparent state-of-charge value adoption device for adopting the apparent state-of-charge value if the capacity difference is at least a predetermined capacity difference that is stored beforehand, wherein the correlation is expressed by Mathematical Expression (1):

$$SOC = \frac{SOCmid - SOClow}{Qhigh - Qlow - Qd} \times (Qmin - Qlow) + SOClow \quad (1)$$

where SOC is the apparent state-of-charge value, and SOCmid is a control center value of the state-of-charge value, and SOClow is a lower limit set value of the state-of-charge value, and SOChigh is an upper limit set value of the state-of-charge value, and Qlow is a capacity value converted from SOClow, and Qhigh is a capacity value converted from SOChigh, and Qd is the capacity difference, and Qmin is the minimum remaining capacity, and Qmax is the maximum remaining capacity, wherein if in Mathematical Expression (1), the denominator on the right-hand side which is presented as Mathematical Expression (2) is at most a predetermined zero-cross reduction preventative value, the zero-cross reduction preventative value is adopted in place of the denominator expressed by Mathematical Expression (2):

$$Qhigh = Qlow = Qd \quad (2).$$

3. A battery pack charge/discharge control apparatus for controlling a charge/discharge of a battery pack that is formed by combining a plurality of unit batteries of a secondary battery type, comprising:

a battery ECU, the battery ECU, comprising:
- a charge/discharge restriction device for restricting the charge/discharge based on at least one of a capacity upper limit value and a capacity lower limit value of the unit batteries constituting the battery pack;
- a remaining capacity detection device for detecting remaining capacities of unit batteries constituting the battery pack;
- a control value computation device for computing a control state-of-charge value based on at least one of a minimum value and a maximum value of the detected remaining capacities;
- a capacity difference computation device for computing, as a capacity difference, a remaining capacity difference between the remaining capacity of a first unit battery and the remaining capacity of a second unit battery among the unit batteries whose remaining capacities have been detected, the remaining capacity of the second unit battery being less than the remaining capacity of the first unit battery;
a storage device for storing a correlation between the capacity difference and an apparent state-of-charge value that is different from the control state-of-charge value;
an apparent state-of-charge value computation device for computing an apparent state-of-charge value with reference to the correlation based on the capacity difference; and
an apparent state-of-charge value adoption device for adopting the apparent state-of-charge value if the capacity difference is at least a predetermined capacity difference that is stored beforehand,
wherein the correlation is expressed by Mathematical Expression (1):

$$SOC = \frac{SOCmid - SOClow}{Qhigh - Qlow - Qd} \times (Qmin - Qlow) + SOClow \quad (1)$$

where Soc is the apparent state-of-charge value, and SOCmid is a control center value of the state-of-charge value, and SOClow is a lower limit set value of the state-of-charge value, and SOChigh is an upper limit set value of the state-of charge value, and Qlow is a capacity value converted from SOClow, and Qhigh is a capacity value converted from SOChigh, and Qd is the capacity difference, and Qmin is the minimum remaining capacity, and Qmax is the maximum remaining capacity,
  wherein if in Mathematical Expression (1), Soc becomes greater than a maximum guard value, the maximum guard value is adopted in place of the term on the left-hand side in Mathematical Expression (1).

4. A battery pack charge/discharge control apparatus for controlling a charge/discharge of a battery pack that is formed by combining a plurality of unit batteries of a secondary battery type, comprising:
  a battery ECU, the battery ECU, comprising:
    a charge/discharge restriction device for restricting the charge/discharge based on at least one of a capacity upper limit value and a capacity lower limit value of the unit batteries constituting the battery pack;
    a remaining capacity detection device for detecting remaining capacities of unit batteries constituting the battery pack;
    a control value computation device for computing a control state-of-charge value based on at least one of a minimum value and a maximum value of the detected remaining capacities;
    a capacity difference computation device for computing, as a capacity difference, a remaining capacity difference between the remaining capacity of a first unit battery and the remaining capacity of a second unit battery among the unit batteries whose remaining capacities have been detected, the remaining capacity of the second unit battery being less than the remaining capacity of the first unit battery;
    a storage device for storing a correlation between the capacity difference and an apparent state-of-charge value that is different from the control state-of-charge value;
    an apparent state-of-charge value computation device for computing an apparent state-of-charge value with reference to the correlation based on the capacity difference; and
    an apparent state-of-charge value adoption device for adopting the apparent state-of-charge value if the capacity difference is at least a predetermined capacity difference that is stored beforehand,
  wherein the correlation is expressed by Mathematical Expression (1):

$$SOC = \frac{SOCmid - SOClow}{Qhigh - Qlow - Qd} \times (Qmin - Qlow) + SOClow \quad (1)$$

where SOC is the apparent state-of-charge value, and SOCmid is a control center value of the state-of-charge value, and SOClow is a lower limit set value of the state-of-charge value, and SOChigh is an upper limit set value of the state-of-charge value, and Qlow is a capacity value converted from SOClow, and Qhigh is a capacity value converted from SOChigh, and Qd is the capacity difference, and Qmin is the minimum remaining capacity, and Qmax is the maximum remaining capacity,
    wherein if in Mathematical Expression (1), SOC becomes less than a minimum guard value, the minimum guard value is adopted in place of the term on the left-hand side in Mathematical Expression (1).

5. A battery pack charge/discharge control apparatus for controlling a charge/discharge of a battery pack that is formed by combining a plurality of unit batteries of a secondary battery type, comprising:
  a remaining capacity detector that detects remaining capacities of unit batteries constituting the battery pack; and
  a controller that restricts the charge/discharge based on at least one of a capacity upper limit value and a capacity lower limit value of the unit batteries constituting the battery pack, computes a control state-of-charge value based on at least one of a minimum value and a maximum value of the detected remaining capacities, computes as a capacity difference, a remaining capacity difference between the remaining capacity of a first unit battery and the remaining capacity of a second unit battery among the unit batteries whose remaining capacities have been detected, the remaining capacity of the second unit battery being less than the remaining capacity of the first unit battery, stores a correlation between the capacity difference and an apparent state-of-charge value that is different from the control state-of-charge value, computes an apparent state-of-charge value with reference to the correlation based on the capacity difference, and the controller adopts the apparent state-of-charge value if the capacity difference is at least a predetermined capacity difference that is stored beforehand,
  wherein the correlation is expressed by Mathematical Expression (1):

$$SOC = \frac{SOCmid - SOClow}{Qhigh - Qlow - Qd} \times (Qmin - Qlow) + SOClow \quad (1)$$

where SOC is the apparent state-of-charge value, and SOCmid is a control center value of the state-of-charge value, and SOClow is a lower limit set value of the state-of-charge value, and SOChigh is an upper limit set value of the state-of-charge value, and Qlow is a capacity value converted from SOClow, and Qhigh is a capacity value converted from SOChigh, and Qd is the capacity difference, and Qmin is the minimum remaining capacity, and Qmax is the maximum remaining capacity.

6. A battery pack charge/discharge control apparatus for controlling a charge/discharge of a battery pack that is formed by combining a plurality of unit batteries of a secondary battery type, comprising:

a remaining capacity detector that detects remaining capacities of unit batteries constituting the battery pack; and a controller that restricts the charge/discharge based on at least one of a capacity upper limit value and a capacity lower limit value of the unit batteries constituting the battery pack, computes a control state-of-charge value based on at least one of a minimum value and a maximum value of the detected remaining capacities, computes as a capacity difference, a remaining capacity difference between the remaining capacity of a first unit battery and the remaining capacity of a second unit battery among the unit batteries whose remaining capacities have been detected, the remaining capacity of the second unit battery being less than the remaining capacity of the first unit battery, stores a correlation between the capacity difference and an apparent state-of-charge value that is different from the control state-of-charge value, computes an apparent state-of-charge value with reference to the correlation based on the capacity difference, and the controller adopts the apparent state-of-charge value if the capacity difference is at least a predetermined capacity difference that is stored beforehand, wherein the correlation is expressed by Mathematical Expression (1):

$$SOC = \frac{SOCmid - SOClow}{Qhigh - Qlow - Qd} \times (Qmin - Qlow) + SOClow \qquad (1)$$

where SOC is the apparent state-of-charge value, and SOCmid is a control center value of the state-of-charge value, and SOClow is a lower limit set value of the state-of-charge value, and SOChigh is an upper limit set value of the state-of-charge value, and Qlow is a capacity value converted from SOClow, and Qhigh is a capacity value converted from SOChigh, and Qd is the capacity difference, and Qmin is the minimum remaining capacity, and Qmax is the maximum remaining capacity wherein if in Mathematical Expression (1), the denominator on the right-hand side which is presented as Mathematical Expression (2) is at most a predetermined zero-cross reduction preventative value (Q3), the zero-cross reduction preventative value is adopted in place of the denominator expressed by Mathematical Expression (2):

Qhigh−Qlow−Qd  (2).

7. A battery pack charge/discharge control apparatus for controlling a charge/discharge of a battery pack that is formed by combining a plurality of unit batteries of a secondary battery type, comprising:

a remaining capacity detector that detects remaining capacities of unit batteries constituting the battery pack; and a controller that restricts the charge/discharge based on at least one of a capacity upper limit value and a capacity lower limit value of the unit batteries constituting the battery pack, computes a control state-of-charge value based on at least one of a minimum value and a maximum value of the detected remaining capacities, computes as a capacity difference, a remaining capacity difference between the remaining capacity of a first unit battery and the remaining capacity of a second unit battery among the unit batteries whose remaining capacities have been detected, the remaining capacity of the second unit battery being less than the remaining capacity of the first unit battery, stores a correlation between the capacity difference and an apparent state-of-charge value that is different from the control state-of-charge value, computes an apparent state-of-charge value with reference to the correlation based on the capacity difference, and the controller adopts the apparent state-of-charge value if the capacity difference is at least a predetermined capacity difference that is stored beforehand, wherein the correlation is expressed by Mathematical Expression (1):

$$SOC = \frac{SOCmid - SOClow}{Qhigh - Qlow - Qd} \times (Qmin - Qlow) + SOClow \qquad (1)$$

where SOC is the apparent state-of-charge value, and SOCmid is a control center value of the state-of-charge value, and SOClow is a lower limit set value of the state-of-charge value, and SOChigh is an upper limit set value of the state-of-charge value, and Qlow is a capacity value converted from SOClow, and Qhigh is a capacity value converted from SOChigh, and Qd is the capacity difference, and Qmin is the minimum remaining capacity, and Qmax is the maximum remaining capacity, wherein if in Mathematical Expression (1), SOC becomes greater than a maximum guard value, the maximum guard value is adopted in place of the term on the left-hand side in Mathematical Expression (1).

8. A battery pack charge/discharge control apparatus for controlling a charge/discharge of a battery pack that is formed by combining a plurality of unit batteries of a secondary battery type, comprising:

a remaining capacity detector that detects remaining capacities of unit batteries constituting the battery pack; and a controller that restricts the charge/discharge based on at least one of a capacity upper limit value and a capacity lower limit value of the unit batteries constituting the battery pack, computes a control state-of-charge value based on at least one of a minimum value and a maximum value of the detected remaining capacities, computes as a capacity difference, a remaining capacity difference between the remaining capacity of a first unit battery and the remaining capacity of a second unit battery among the unit batteries whose remaining capacities have been detected, the remaining capacity of the second unit battery being less than the remaining capacity of the first unit battery, stores a correlation between the capacity difference and an apparent state-of-charge value that is different from the control state-of-charge value, computes an apparent state-of-charge value with reference to the correlation based on the capacity difference, and the controller adopts the apparent state-of-charge value if the capacity difference is at least a predetermined capacity difference that is stored beforehand, wherein the correlation is expressed by Mathematical Expression (1):

$$SOC = \frac{SOCmid - SOClow}{Qhigh - Qlow - Qd} \times (Qmin - Qlow) + SOClow \quad (1)$$

where SOC is the apparent state-of-charge value, and SOCmid is a control center value of the state-of-charge value, and SOClow is a lower limit set value of the state-of-charge value, and SOChigh is an upper limit set value of the state-of-charge value, and Qlow is a capacity value converted from SOClow, and Qhigh is a capacity value converted from SOChigh, and Qd is the capacity difference, and Qmin is the minimum remaining capacity, and Qmax is the maximum remaining capacity wherein if in Mathematical Expression (1), SOC becomes less than a minimum guard value, the minimum guard value is adopted in place of the term on the left-hand side in Mathematical Expression (1).

* * * * *

UNITED STATES PATENT AND TRADEMARK OFFICE
CERTIFICATE OF CORRECTION

PATENT NO. : 7,439,710 B2  
APPLICATION NO. : 10/563462  
DATED : October 21, 2008  
INVENTOR(S) : Teruo Ishishita It is certified that error appears in the above-identified patent and that said Letters Patent is hereby corrected as shown below:

| Column | Line | |
|---|---|---|
| 10 | 16 | Change "in complete" to --incomplete--. |
| 13 Claim 3 | 32 | Change "Soc" to --SOC--. |

Signed and Sealed this

Second Day of June, 2009

JOHN DOLL  
*Acting Director of the United States Patent and Trademark Office*